United States Patent
Huang et al.

(10) Patent No.: US 10,991,422 B2
(45) Date of Patent: Apr. 27, 2021

(54) DATA STORAGE DEVICE USING A HOST MEMORY BUFFER FOR SINGLE-LEVEL CELL STORAGE AND CONTROL METHOD FOR NON-VOLATILE MEMORY

(71) Applicant: Silicon Motion, Inc., Jhubei (TW)

(72) Inventors: Chien-Ting Huang, New Taipei (TW); Liang-Cheng Chen, Pitou Township, Changhua County (TW)

(73) Assignee: SILICON MOTION, INC., Jhubei (TW)

( * ) Notice: Subject to any disclaimer, the term of this patent is extended or adjusted under 35 U.S.C. 154(b) by 15 days.

(21) Appl. No.: 16/524,113

(22) Filed: Jul. 28, 2019

(65) Prior Publication Data

US 2020/0098423 A1 Mar. 26, 2020

Related U.S. Application Data

(60) Provisional application No. 62/736,517, filed on Sep. 26, 2018.

(30) Foreign Application Priority Data

Apr. 11, 2019 (TW) .................... 108112760

(51) Int. Cl.
*G11C 16/00* (2006.01)
*G11C 11/419* (2006.01)
(Continued)

(52) U.S. Cl.
CPC ........ *G11C 11/419* (2013.01); *G06F 12/0246* (2013.01); *G06F 13/1673* (2013.01); *G11C 11/2257* (2013.01); *G11C 11/5628* (2013.01)

(58) Field of Classification Search
CPC ............ G06F 12/0246; G06F 13/1673; G11C 16/0483; G11C 16/10
(Continued)

(56) References Cited

U.S. PATENT DOCUMENTS 9,947,412 B1 4/2018 Hu
2009/0040825 A1 2/2009 Adusumilli et al.
(Continued)

FOREIGN PATENT DOCUMENTS

CN 101464834 A 6/2009
CN 101483067 A 7/2009
(Continued)

OTHER PUBLICATIONS

Non-Final Office Action dated Jul. 13, 2020, issued in U.S. Appl. No. 16/524,114.

*Primary Examiner* — Alfredo Bermudez Lozada
(74) *Attorney, Agent, or Firm* — McClure, Qualey & Rodack, LLP

(57) ABSTRACT

High-efficiency control technology for non-volatile memory. A non-volatile memory has single level cells (SLCs) and multiple level cells (e.g., MLCs or TLCs) and is controlled by a controller. According to the controller at the device end, a host allocates a system memory to provide a host memory buffer (HMB). The controller at the device end uses the HMB to buffer write data issued by the host, and then flushes the write data from the HMB to multi-level cells of the non-volatile memory without passing single level cells of the non-volatile memory to reduce write amplification problems due to the frequent use of the single-level cells.

16 Claims, 5 Drawing Sheets

(51) Int. Cl.
  *G11C 11/22* (2006.01)
  *G06F 13/16* (2006.01)
  *G06F 12/02* (2006.01)
  *G11C 11/56* (2006.01)

(58) Field of Classification Search
  USPC .......................................... 365/185.05, 185.17
  See application file for complete search history.

(56) References Cited

U.S. PATENT DOCUMENTS

| | | |
|---|---|---|
| 2010/0205352 A1 | 8/2010 | Chu et al. |
| 2013/0322169 A1 | 12/2013 | Goss et al. |
| 2016/0266826 A1* | 9/2016 | Ooneda ................. G11C 29/52 |
| 2017/0017570 A1 | 1/2017 | Yeh et al. |
| 2017/0185337 A1 | 6/2017 | Lee |
| 2018/0074730 A1 | 3/2018 | Inoue et al. |
| 2018/0121128 A1 | 5/2018 | Doyle |

FOREIGN PATENT DOCUMENTS

| | | |
|---|---|---|
| TW | 200915335 A | 4/2009 |
| TW | 201030521 A1 | 8/2010 |
| TW | 201702877 A | 1/2017 |
| TW | 201724110 A | 7/2017 |
| TW | 1615711 B | 2/2018 |

* cited by examiner

HMB_Tab

| HMB Address | Logical Block Address (LBA) |
|---|---|
| 0x40000000 | 1000 |
| 0x40001000 | 1001 |
| 0x40002000 | 1002 |
| ... | ... |
| 0x4002E000 | 1046 |
| 0x4002F000 | 1047 |

DATA STORAGE DEVICE USING A HOST MEMORY BUFFER FOR SINGLE-LEVEL CELL STORAGE AND CONTROL METHOD FOR NON-VOLATILE MEMORY

CROSS REFERENCE TO RELATED APPLICATIONS

This Application claims the benefit of U.S. Provisional Application No. 62/736,517, filed on Sep. 26, 2018, the entirety of which is incorporated by reference herein.

This Application also claims priority of Taiwan Patent Application No. 108112760, filed on Apr. 11, 2019, the entirety of which is incorporated by reference herein.

BACKGROUND OF THE INVENTION

Field of the Invention

The present invention is related to control techniques for non-volatile memory.

Description of the Related Art

There are various forms of non-volatile memory (NVM) for long-term data storage, such as flash memory, magnetoresistive RAM, ferroelectric RAM, resistive RAM, spin transfer torque-RAM (STT-RAM), and so on. These non-volatile memories may be used as the storage medium in a data storage device.

Non-volatile memory typically has its particular storage characteristics. The technical field needs to develop the corresponding control technology.

BRIEF SUMMARY OF THE INVENTION

In accordance with an exemplary embodiment of the present invention, a data storage device includes a non-volatile memory and a controller. The non-volatile memory has single-level cells (SLCs) and multi-level cells (MLCs). The controller operates the non-volatile memory as requested by a host. The controller requests the host to allocate a system memory of the host to provide a host memory buffer (HMB). The controller temporarily stores write data issued by the host in the host memory buffer. The controller flushes the write data temporarily stored in the host memory buffer to the multi-level cells of the non-volatile memory without passing the single-level cells of the non-volatile memory.

In an exemplary embodiment, the controller manages a mapping table to record logical addresses of data stored in the different memory cells of the host memory buffer. According to a logical address of the write data, the controller searches the mapping table. When the logical address of the write data has been recorded in the mapping table, the controller uses the write data to overwrite a space in the host memory buffer that stores an old data version of the logical address. When the logical address of the write data has not been recorded in the mapping table, the controller programs the write data to a spare area of the host memory buffer for temporary storage of the write data and updates the mapping table.

In an exemplary embodiment, when data buffered in the host memory buffer reaches a preset amount, the controller flushes the data of the preset amount from the host memory buffer to the multi-level cells of the non-volatile memory without passing the single-level cells of the non-volatile memory. The preset amount may equal to a data amount controlled through one word line.

In an exemplary embodiment, the controller has a read and write data buffer. After retrieving the write data from the host memory buffer, the controller uses the read and write data buffer to buffer the retrieved write data and then writes the buffered write data to the multi-level cells of the non-volatile memory without passing the single-level cells of the non-volatile memory.

When receiving a write command issued by the host that indicates the write data, the controller may use the read and write register to buffer the write data and then upload the write data from the read and write register to the host memory buffer to be retrieved by the controller later.

In an exemplary embodiment, the controller searches the mapping table according to the logical address indicated in a read command issued by the host. When the logical address indicated in the read command has been recorded in the mapping table, the controller retrieves the read data from the host memory buffer to answer the host.

In an exemplary embodiment, the controller uses the read and write data buffer to buffer the read data retrieved from the host memory buffer to answer the host.

A non-volatile memory control method in accordance with an exemplary embodiment of the present invention includes the following steps: operating a non-volatile memory as requested by a host, wherein the non-volatile memory has single-level cells and multi-level cells; requesting the host to allocate a system memory of the host to provide a host memory buffer; temporarily storing write data issued by the host in the host memory buffer; and flushing the write data temporarily stored in the host memory buffer to the multi-level cells of the non-volatile memory without passing the single-level cells of the non-volatile memory.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
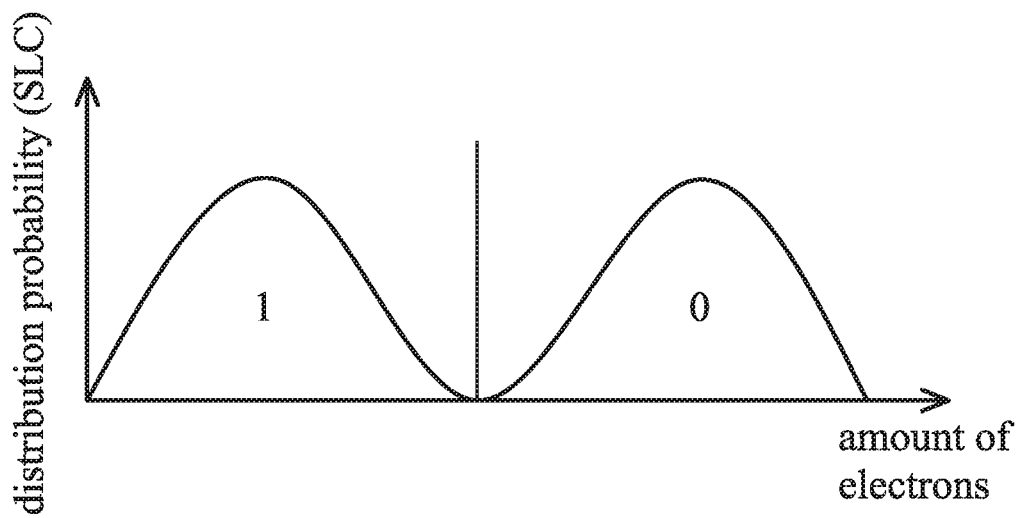
FIG. 1A and FIG. 1B respectively correspond to SLCs and TLCs, which show the distribution probability of gate floating electrons for the different logical levels.

The following description shows exemplary embodiments of carrying out the invention. This description is made for the purpose of illustrating the general principles of the invention and should not be taken in a limiting sense. The scope of the invention is best determined by reference to the appended claims.

A non-volatile memory for long-term data retention may be a flash memory, a magnetoresistive RAM, a ferroelectric RAM, a resistive RAM, a spin transfer torque-RAM (STT-RAM) and so on. The following discussion uses flash memory as an example.

Today's data storage devices often use flash memory as the storage medium for storing user data from the host. There are many types of data storage devices, including memory cards, USB flash devices, SSDs, and so on. In another exemplary embodiment, a flash memory may be packaged with a controller to form a multiple-chip package called eMMC.

A data storage device using a flash memory as a storage medium can be applied in a variety of electronic devices, including a smartphone, a wearable device, a tablet computer, a virtual reality device, etc. A calculation module of an electronic device may be regarded as a host that operates a data storage device equipped on the electronic device to access a flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

A flash memory has its special storage characteristics, as described below.

The host distinguishes the flash memory storage contents by logical addresses (for example, according to a logical block address LBA or a global host page number GHP, etc.). The physical space of a flash memory is divided into a plurality of blocks. Each block includes a plurality of pages. Each page includes N sectors, and N is an integer greater than one, such as: 4. A 16 KB page may be divided into four sectors, each of which is 4 KB (corresponding to one LBA or GHP). In an exemplary embodiment, a block is progressively allocated to store data according to the page number (e.g. from low page number to high page number).

In particular, the storage space of the flash memory needs to be erased before being used again. In an exemplary embodiment, the minimum unit of space erasure is a block. The used blocks must be erased before being used again. The updated data of the same logical address is not written to the storage space of the old data. The new version of data must be written to a spare area (e.g. a blank sector). The contents of the old data space are marked as invalid. A block may only retain sporadic valid data. Garbage collection is required when there are not enough spare blocks. The sporadic valid data retained in one block is collected to another block by garbage collection. Blocks that contain only invalid data are erased and reused. The number of spare blocks, therefore, is increased.

In addition to the garbage collection due to the insufficient spare blocks, there are many other operations involving valid data transfer.

The storage cells of the flash memory are not limited to single-level cells (SLCs). A flash memory may further include a space of multi-level cells, e.g. triple-level cells (TLCs) or quad-level cells (QLCs). Each SLC stores one bit of data, each TLC stores three bits of data, and so on. In order to simplify the description, the TLCs are discussed in the following description as an example of multi-level cells, but not limited thereto.

Figure 1B:
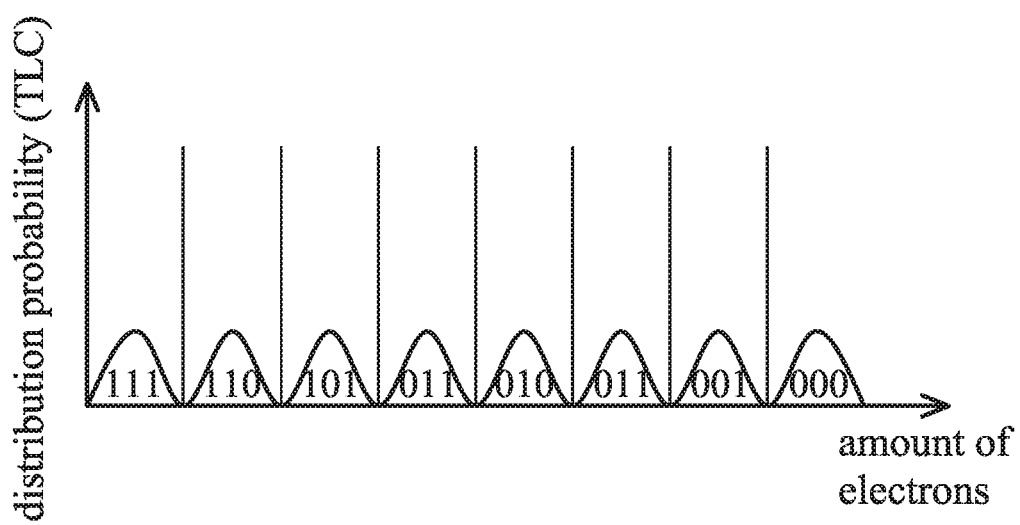

FIG. 1A and FIG. 1B respectively correspond to SLCs and TLCs, which show the distribution probability of gate floating electrons for the different logical levels. As shown, the logical level of a memory cell is determined according to its gate floating electron amount. The logical boundary of SLCs is clearer than TLCs. SLCs have higher reliability, and faster writing speed. The TLCs have advantages in storage capacity. For the pursuit of accuracy and speed, the SLCs are the ideal storage target. SLC data, however, typically needs to be moved to TLCs for a higher storage capacity. Therefore, SLCs are frequently written and erased, causing write amplification problems. The number of erasure of SLC blocks may increase sharply in a short period of time, and the flash memory is easily damaged.

To guarantee the lifetime of flash memory, optimization of the use of SLCs and TLCs is presented the following description.

Figure 2:
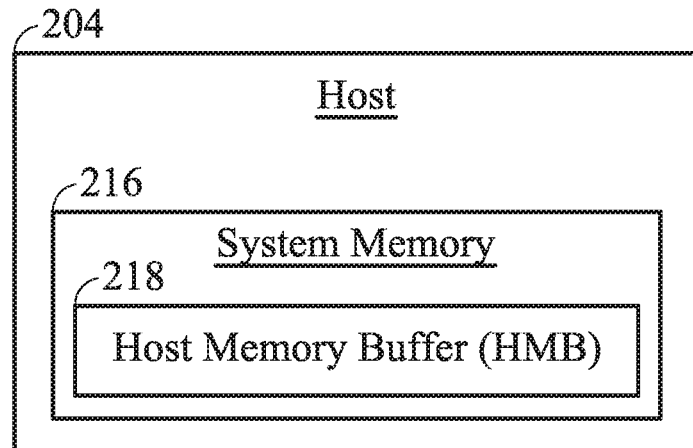
FIG. 2 is block diagram depicting a data storage system 200 in accordance with an exemplary embodiment of the present invention, including a data storage device 202 and a host 204.

FIG. 2 is block diagram depicting a data storage system 200 in accordance with an exemplary embodiment of the present invention, including a data storage device 202 and a host 204. The data storage device 202 has a flash memory 206 and a controller 208. The data storage device 202 does not have a dynamic random access memory (DRAM) or it may only have a small DRAM (i.e. a partial DRAM technology). In order to simplify the description, the data storage device 202 in the following description does not own a DRAM but it is not intended to be limited thereto.

The host 204 issues a read or a write request to the controller 208, and the controller 208 performs a read or a write operation on the flash memory 206. The controller 208 has a read and write (read/write) data buffer 210, which may be a static random access memory (SRAM) or other storage device. The flash memory 206 has an SLC block pool 212 and a TLC block pool 214, including SLC blocks and TLC blocks, respectively. In an exemplary embodiment, a TLC block may emulate the function of an SLC block and, under this setting, TLC blocks are programmed in a preset manner without affecting the programming of the SLC blocks which are programmed based on the SLC concept. In another exemplary embodiment, SLC blocks and TLC blocks exist and operate independently, and are programmed in the respective programming modes.

The host 204 has a system memory 216 that may be a DRAM or other storage devices. After the data storage system 200 is booted up, the controller 208 of the data storage device 202 issues a request to the host 204 for host memory buffering. Accordingly, the host 204 arranges a buffering space 218 in the system memory 216 as a host memory buffer (HMB).

In conventional techniques, the controller 208 first uses the read/write data buffer 210 to buffer the data issued by the host 204, then writes the data buffered in the read/write data buffer 210 to SLC blocks, and finally moves the SLC data to TLC blocks. In the present invention, a specific writing procedure is introduced. The controller 208 uses the HMB 218 for temporary storage of the data issued by the host 204 and then writes the data temporarily stored in the HMB 218 to the read/write data buffer 210. Specifically, the controller 208 programs the data temporarily stored in the data buffer 210 to TLC blocks without passing the SLC blocks. As described above, the present invention avoids to use the SLC blocks. Therefore, the probability of data transfer from SLC blocks to the TLC blocks is reduced, effectively solving the write amplification problem.

There are many advantages to use the HMB 218 to temporarily store data. Overwriting the same physical space is not allowed in the flash memory 206. Because the data is temporarily stored in the HMB 218 rather than the SLC or TLC blocks, the erase counts of the SLC and TLC blocks are not increased by the temporary storage of data. The lifetime of the SLC and TLC blocks is expanded. Furthermore, the HMB 218 may work as a cache. When the host 204 issues a read command and the target data is temporarily stored in the HMB 218, the controller 208 may respond to the read command by accessing the target data from the HMB 218.

Figure 3:
FIG. 3 depicts an HMB mapping table HMB_Tab that records the mapping between the physical address of the HMB 218 (HMB address) and the logical address of data stored in the HMB 218 (e.g. LBA)

As shown in FIG. 3, the controller 208 preferably establishes an HMB mapping table HMB_Tab to record the mapping between the physical address of the HMB 218 (HMB address) and the logical address of data stored in the HMB 218 (e.g. LBA). The HMB address allocated for data storage is specified by the host 204, and the controller 208 temporarily stores data to the HMB 218 according to the specified HMB address. For example, an HMB address may be allocated for temporary storage of 48 sectors of data. The HMB mapping table HMB_Tab may be established on the HMB 218. When any data stored to or updated to the HMB 218, the controller 208 downloads all or a part of the HMB mapping table HMB_Tab from the HMB 218 to the read/write data buffer 210, and updates the HMB mapping table HMB_Tab, and then uploads the updated HMB mapping table HMB_Tab to the HMB 218. In another exemplary embodiment, the HMB mapping table HMB_Tab is established in the read/write data buffer 210. When any data is temporarily stored to or updated to the HMB 218, the controller 208 directly updates the HMB mapping table HMB_Tab on the buffer at the device end.

Figure 4:
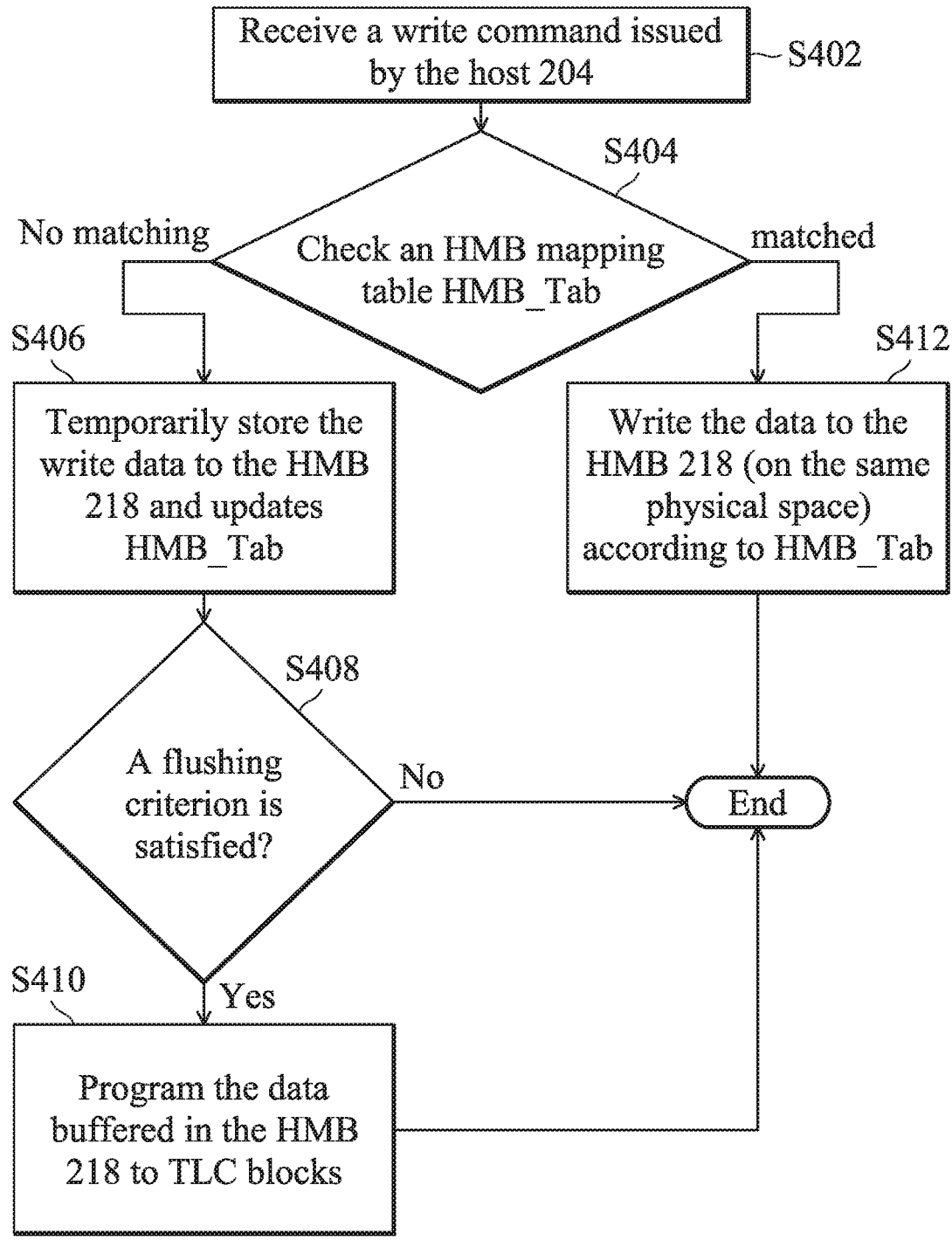
FIG. 4 is a flowchart depicting a programming procedure in accordance with an exemplary embodiment of the present invention.

FIG. 4 is a flowchart depicting a programming procedure in accordance with an exemplary embodiment of the present invention. The controller 208 of the data storage device 202 (controller at the device end) may operate according to the programming procedure to extend the lifetime of the data storage device 202.

In step S402, the controller 208 receives a write command issued by the host 204. The write command indicates write data and logical address of the write data.

In step S404, the controller 208 checks an HMB mapping table HMB_Tab to determine whether the write data has been cached in the HMB 218. If yes, step S412 is performed. If no, step S406 is performed. The controller 208 searches the HMB mapping table HMB_Tab according to the logical address of the write data. If the logical address of the write data is not listed in the HMB mapping table HMB_Tab, the write data cannot be found in the HMB 218 and should be temporarily stored in the HMB 218. If the logical address of the write data has been recorded in the HMB mapping table HMB_Tab, the previous version of data of the logical address can be found in HMB 218 and is updated (on the HMB 218) by the write data.

In step S406, the controller 208 temporarily stores the write data to the HMB 218 and updates the HMB mapping table HMB_Tab. For example, in response to writing data of LBA #1046 to the HMB 218 as indicated by the physical address 0x4002E000, a mapping between LBA #1046 and HMB address 0x4002E000 is added to the HMB mapping table HMB_Tab.

In step S408, the controller 208 determines whether the data amount of the HMB 218 satisfies a criterion for flushing data from the HMB 218 to the flash memory 206. The criterion is preferably a positive integer multiple of the sector size or page size. For example, the criterion may be 48 sectors or 12 pages. In an exemplary embodiment, the flushing size is the data amount of storage cells controlled by the same word line. When the criterion is not satisfied, the controller 208 may end the procedure and the write data is buffered in the HMB 218.

When the criterion is satisfied, step S410 is performed. The controller 208 programs the data buffered in the HMB 218 to TLC blocks (which may be passed through the read/write data buffer 210). The controller 208 is operated in a special mode (different from a conventional mode that operates SLC blocks as an intermediate storage space), and data buffered in the HMB 218 is programmed to TLC blocks without using SLC blocks as the intermediate storage space. In this manner, the use of SLC blocks is reduced (avoided). The controller 208 may program all the data buffered in the HMB 218 to the TLC blocks, or it may only program a preset amount of data buffered in the HMB 218 to the TLC block. In an exemplary embodiment, there are 48 sectors buffered in the HMB 218, the controller 208 may program 16 sectors to a TLC block per programming operation. In an exemplary embodiment, the preset amount depends on the number of storage cells controlled by the same word line. In an exemplary embodiment, a TLC block allocated for the flushing is regarded as an active block.

After flushing the data temporarily stored in the HMB 218 to TLC blocks, the controller 208 immediately updates a logical-to-physical mapping table L2P. In another exemplary embodiment, the update of the logical-to-physical mapping table L2P may be performed later (e.g. when an additional condition is satisfied). The logical-to-physical mapping table L2P lists the mapping information between logical address and physical address for the data stored in the flash memory 206.

When it is determined in step S404 that the logical address of data indicated in a write command issued by the host 204 has been listed in the HMB mapping table HMB_Tab, step S412 is performed. The controller 208 writes the data to the HMB 218 (on the same physical space) according to the HMB mapping table HMB_Tab. The HMB mapping table HMB_Tab is not modified to show that the data is still available in the HMB 218. For example, by checking the HMB mapping table HMB_Tab, the controller 208 gets a physical address of the HMB 218 where stores the old version of the currently-issued write data. The HMB mapping table HMB_Tab shows that the physical address 0x40001000 of the HMB 218 maps to logical address LBA #1001. To update the data of LBA #1001, the controller 208 overwrites the old data at the physical address 0x40001000. The update of data of LBA #1001 is performed on the same HMB space. Since the update is performed by overwriting at the same physical address, the controller 208 does not need to modify the HMB mapping table HMB_Tab and the procedure ends.

Figure 5:
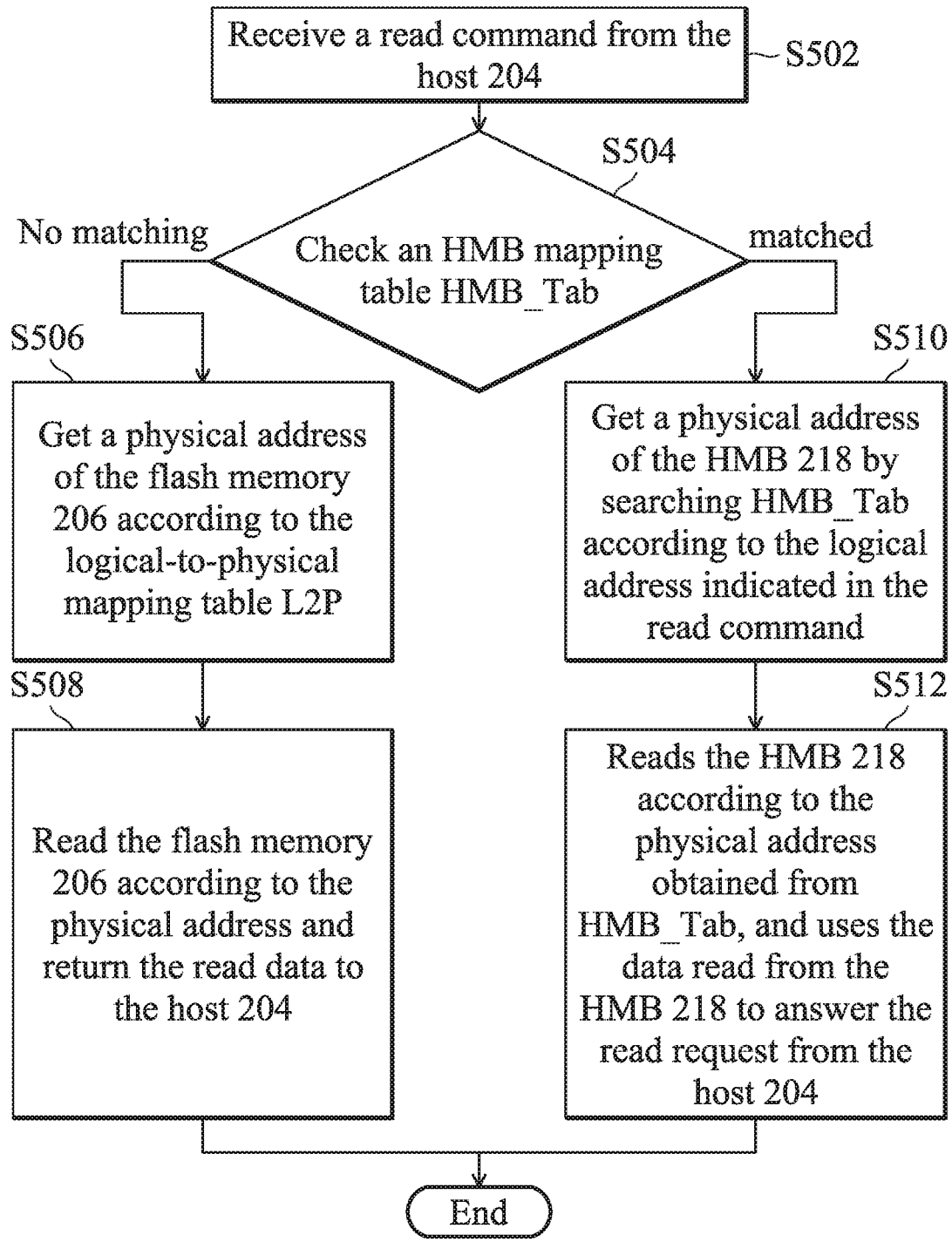
FIG. 5 is a flowchart illustrating a data reading procedure in accordance with an exemplary embodiment of the present invention.

FIG. 5 is a flowchart illustrating a data reading procedure in accordance with an exemplary embodiment of the present invention. The controller 208 of the data storage device 202 (controller at the device end) may operate according to the data reading procedure to extend the lifetime of the data storage device 202.

In step S502, the controller 208 receives a read command from the host 204. The read command indicates a logical address of the data to be read.

In step S504, the controller 208 determines whether the logical address is listed in the HMB HMB_Tab. If not, step S506 is performed. If yes, step S510 is performed.

In step S506, the controller 208 gets a physical address of the flash memory 206 according to the logical-to-physical mapping table L2P.

In step S508, the controller 208 reads the flash memory 206 according to the physical address and returns the read data to the host 204. The controller 208 first stores the read data to the read/write data buffer 210 and then uploads the read data from the read/write data buffer 210 to the host 204.

When it is determined in step S504 that the logical address of data indicated in a read command issued by the host 204 has been listed in the HMB mapping table HMB_Tab, step S510 is performed. The controller 208 gets a physical address of the HMB 218 by searching the HMB mapping table HMB_Tab according to the logical address indicated in the read command.

In step S512, the controller 208 reads the HMB 218 according to the physical address obtained from the HMB mapping table HMB_Tab, and uses the data read from the HMB 218 to answer the read request from the host 204. After reading the HMB 218 according to the physical address obtained from the HMB mapping table HMB_Tab, the controller 208 temporarily stores the read data in the read/write data buffer 210, and then answers the host 204 by the data temporarily stored in the read/write data buffer 210.

In the aforementioned techniques, the HMB 218 is operated to improve the operations of the flash memory 206. Write data issued by the host 204 may be buffered in the HMB 218 and then programmed to TLC blocks without using the SLC blocks. Any techniques using the HMB 218 based on the aforementioned discussion should be considered within the scope of the present invention. The foregoing concept of the present invention may be further applied to a method for controlling a non-volatile memory.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a non-volatile memory, having single-level cells and multi-level cells; and
a controller, operating the non-volatile memory as requested by a host,
wherein:
the controller requests the host to allocate a system memory of the host to provide a host memory buffer;
the controller temporarily stores write data issued by the host in the host memory buffer;
the controller flushes the write data temporarily stored in the host memory buffer to the multi-level cells of the non-volatile memory without passing the single-level cells of the non-volatile memory;
the controller manages a mapping table to record logical addresses of data stored in the different memory cells of the host memory buffer;
according to a logical address of the write data, the controller searches the mapping table; and
when the logical address of the write data has been recorded in the mapping table, the controller uses the write data to overwrite a space in the host memory buffer that stores an old data version of the logical address.

2. The data storage device as claimed in claim 1, wherein:
when the logical address of the write data has not been recorded in the mapping table, the controller programs the write data to a spare area of the host memory buffer for temporary storage of the write data and updates the mapping table.

3. The data storage device as claimed in claim 2, wherein:
when data buffered in the host memory buffer reaches a preset amount, the controller flushes the data of the preset amount from the host memory buffer to the multi-level cells of the non-volatile memory without passing the single-level cells of the non-volatile memory.

4. The data storage device as claimed in claim 3, wherein:
the preset amount is equal to a data amount controlled through one word line.

5. The data storage device as claimed in claim 1, wherein:
the controller has a read and write data buffer; and
after retrieving the write data from the host memory buffer, the controller uses the read and write data buffer to buffer the retrieved write data and then writes the buffered write data to the multi-level cells of the non-volatile memory without passing the single-level cells of the non-volatile memory.

6. The data storage device as claimed in claim 5, wherein:
when receiving a write command issued by the host that indicates the write data, the controller uses the read and write data buffer to buffer the write data and then uploads the write data from the read and write data buffer to the host memory buffer to be retrieved by the controller later.

7. The data storage device as claimed in claim 1, wherein:
the controller manages a mapping table to record logical addresses of data stored in the different memory cells of the host memory buffer;
according to the logical address indicated in a read command issued by the host, the controller searches the mapping table; and
when the logical address indicated in the read command has been recorded in the mapping table, the controller retrieves the read data from the host memory buffer to answer the host.

8. The data storage device as claimed in claim 7, wherein:
the controller has a read and write data buffer; and
the controller uses the read and write data buffer to buffer the read data retrieved from the host memory buffer to answer the host.

9. A non-volatile memory control method, comprising:
operating a non-volatile memory as requested by a host, wherein the non-volatile memory has single-level cells and multi-level cells;
requesting the host to allocate a system memory of the host to provide a host memory buffer;
temporarily storing write data issued by the host in the host memory buffer;
flushing the write data temporarily stored in the host memory buffer to the multi-level cells of the non-volatile memory without passing the single-level cells of the non-volatile memory;
managing a mapping table to record logical addresses of data stored in the different memory cells of the host memory buffer;
searching the mapping table according to a logical address of the write data; and
when the logical address of the write data has been recorded in the mapping table, using the write data to overwrite a space in the host memory buffer that stores an old data version of the logical address.

10. The non-volatile memory control method as claimed in claim 9, further comprising:
when the logical address of the write data has not been recorded in the mapping table, programming the write data to a spare area of the host memory buffer for temporary storage of the write data and updating the mapping table.

11. The non-volatile memory control method as claimed in claim 10, further comprising:
when data buffered in the host memory buffer reaches a preset amount, flushing the data of the preset amount from the host memory buffer to the multi-level cells of the non-volatile memory without passing the single-level cells of the non-volatile memory.

12. The non-volatile memory control method as claimed in claim 11, wherein:
the preset amount is equal to a data amount controlled through one word line.

13. The non-volatile memory control method as claimed in claim 9, further comprising:
providing a read and write data buffer at a device end; and
after retrieving the write data from the host memory buffer, using the read and write data buffer to buffer the retrieved write data and then writing the buffered write data to the multi-level cells of the non-volatile memory without passing the single-level cells of the non-volatile memory.

14. The non-volatile memory control method as claimed in claim 13, wherein:
when receiving a write command indicating the write data and issued by the host that, using the read and write data buffer to buffer the write data and then uploading the write data from the read and write data buffer to the host memory buffer to be downloaded to the device end later.

15. The non-volatile memory control method as claimed in claim 9, further comprising:
managing a mapping table to record logical addresses of data stored in the different memory cells of the host memory buffer;
searching the mapping table according to the logical address indicated in a read command issued by the host; and
when the logical address indicated in the read command has been recorded in the mapping table, retrieving the read data from the host memory buffer to answer the host.

16. The non-volatile memory control method as claimed in claim 15, further comprising:
providing a read and write data buffer at a device end; and
using the read and write data buffer to buffer the read data retrieved from the host memory buffer to answer the host.

* * * * *